United States Patent [19]

Redman et al.

[11] Patent Number: 5,536,905

[45] Date of Patent: Jul. 16, 1996

[54] SELF SECURED HOUSING FOR ELECTRONICS

[75] Inventors: Brian Redman; Poh C. Low, both of Richmond; Yiu-Kwong Chan, Surrey, all of Canada

[73] Assignee: Motorola, Inc., Schaumburg, Ill.

[21] Appl. No.: 222,059

[22] Filed: Apr. 4, 1994

[51] Int. Cl.$^6$ .................................................. H05K 9/00
[52] U.S. Cl. .................... 174/35 GC; 174/35 R; 361/816
[58] Field of Search .............. 174/35 R, 35 GC, 174/35 MS; 361/816, 818, 615, 740, 747, 759

[56] References Cited

U.S. PATENT DOCUMENTS

| | | | |
|---|---|---|---|
| 5,014,160 | 5/1991 | McCoy, Jr. | 174/35 GC X |
| 5,095,177 | 3/1992 | Johnson | 174/35 R |
| 5,339,222 | 8/1994 | Simmons et al. | 174/35 R X |
| 5,353,201 | 10/1994 | Maeda | 361/816 |
| 5,354,951 | 10/1994 | Lange, Sr. et al. | 174/35 R |
| 5,386,340 | 1/1995 | Kuiz | 361/737 |

OTHER PUBLICATIONS

Amp of Canada, catalog 65701, issued Jul. 1993, "Memory Card/PC Card Connectors", product brochure.

Primary Examiner—Laura Thomas
Assistant Examiner—Christopher Horgan
Attorney, Agent, or Firm—Charles W. Bethards; Kevin A. Buford

[57] ABSTRACT

A self secured housing includes a frame with openings, a first cover disposed on a first side of the frame and mechanically coupled to a plurality of semi flexible first fingers that are arranged for disposal in the openings with some of the semi flexible first fingers having a concave interlocking detail, and a second cover disposed on a second side of the frame and mechanically coupled to a plurality of semi flexible second fingers that are similarly arranged for disposal in the openings. The second fingers are further arranged to urge a corresponding one of the first fingers toward a side of the opening and engage the convex interlocking detail with the concave interlocking detail, thereby securing the frame between the first cover and the second cover.

5 Claims, 2 Drawing Sheets

SELF SECURED HOUSING FOR ELECTRONICS

FIELD OF THE INVENTION

This invention generally deals with housings for electronic assembles and more particularly but not limited to such housings that are self secured and may provide electromagnetic shielding.

BACKGROUND OF THE INVENTION

Housings or packages for electronics are known. Such housings have taken many forms and have addressed many problems. Most such housings and associated techniques are not particularly useful where the application dictates severe constraints on the physical dimensions of the housing. Newly emerging applications with such size constraints include, for example, those defined by the Personal Computer Memory Card International Association (PCMCIA). Presently defined standards include a type I, type II, and type III package size. Generally these packages are 85.6 millimeters (mm) by 54 mm by, respectively, 3.3, 5, or 10 mm in thickness.

For these PCMCIA packages various approaches have been proposed, including essentially a frame and relatively thin covers secured to the frame by either adhesives or albeit small but nevertheless conventional mechanical fasteners or screws. This approach to a housing, while satisfying the size requirements presents problems regarding assembly efficiency, electromagnetic shielding, and possibly aesthetics.

Another approach, commercially available, that in summary represents a frame together with covers intended to lock over the periphery of the frame presents problems of housing or package integrity in many environments and does not provide satisfactory electromagnetic shielding.

Practitioners have used a two piece shield for internal applications. Generally this includes a peripheral fence that is rigidly attached to a carrier and a cover that interlocks to the fence to provide an electromagnetic shield. Unfortunately this approach requires a rigidly fixed fence, is not sufficiently esthetically pleasing for an exterior package or housing, and the interlocking details may be subject to damage if used in an external application. Thus a clear need exists for a rugged esthetically pleasing housing that may be efficiently assembled and used for electromagnetic shielding.

BRIEF DESCRIPTION OF THE DRAWINGS

The features of the present invention which are believed to be novel are set forth with particularity in the appended claims. However, the invention together with further advantages thereof, may best be understood by reference to the accompanying drawings in which:

DETAILED DESCRIPTION OF A PREFERRED EMBODIMENT

Generally the instant invention provides a housing or package that may be advantageously deployed to house and protect an electronics assembly (123), such as a wireless data modem in a relatively diminutive and space efficient physical volume, such as required to satisfy a PCMCIA industry standard. Preferably the housing includes a frame together with a first and a second cover. The first and the second cover are configured and arranged to interlock with one another and, preferably, to further interlock with the frame in a fashion that advantageously secures all three pieces into a housing that may be, simultaneously, small, durable, esthetically pleasing, easy to assemble, and a superior electromagnetic shield.

In particular, a preferred embodiment of the instant invention provides a 'snap together' housing that may be readily assembled and disassembled with simple single axis force and without additional tools, operations, processes, or mechanical fasteners, such as screws. Interlocking tabs among other mating features of the covers and the frame in the preferred embodiment are designed to be self-aligning and to allow for single axis assembly, thus facilitating a relatively simple robotics based manufacturing assembly process. The assembly process requires nothing other than firm pressure along the axis of assembly and the assembled housing has been shown to have exceptional integrity with no evidence of inadvertent disassembly. The covers may be fashioned from many metallic materials, such as phosphor bronze or stainless steel, and that together with controlling the dimensions of any allowed openings between, for example, the interlocking tabs results in a superior electromagnetic shield.

Additionally, the interlocking tabs which facilitate the electromagnetic shield are substantially hidden within the body of the frame when assembled, so as to require no additional cosmetic devices to conceal. Further the preferred embodiment advantageously uses covers with an external substantially planar surface to provide a natural surface that may be used, by for example painting or labeling, to establish the major aesthetic characteristics of the housing.

Figure 1:
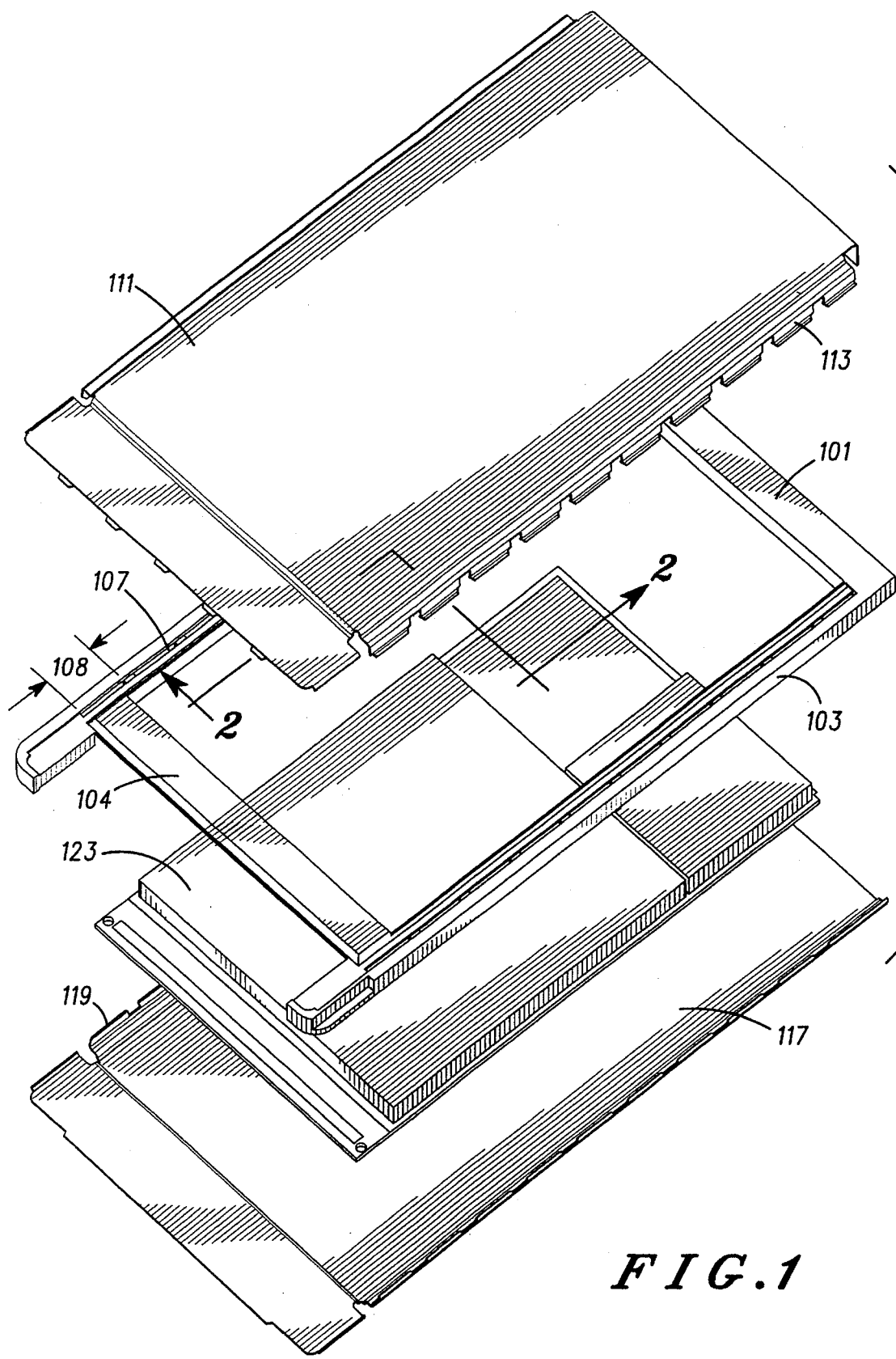
FIG. 1 is an exploded view, in perspective, demonstrating the major housing components in accordance with an embodiment of the instant invention.
Figure 2:
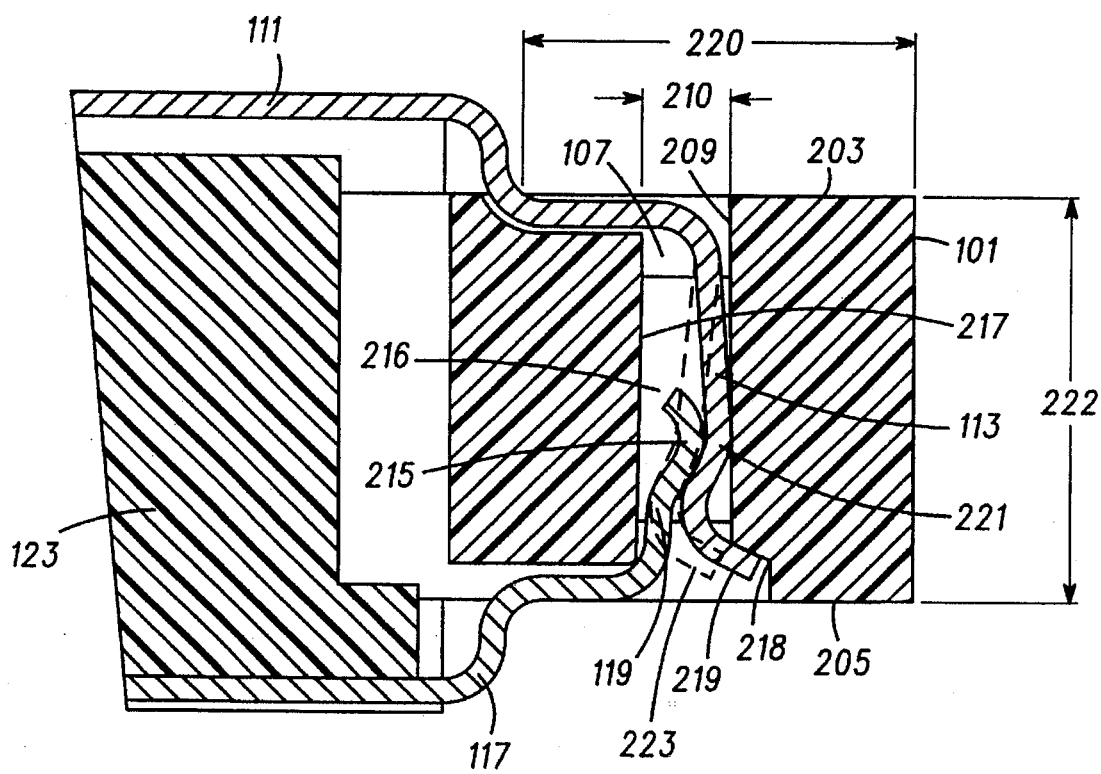
FIG. 2 is a detailed cross sectional diagram of a portion of the FIG. 1 embodiment as assembled.

The present invention can be more fully appreciated by referring to the preferred embodiment depicted in the figures together with the following description. FIG. 1 illustrates an exploded view, in perspective, of the major housing components of a preferred embodiment of the instant invention. FIG. 2 is a detailed cross sectional diagram of a portion of the FIG. 1 embodiment as assembled. Specifically, FIG. 1 depicts a self secured housing that includes a frame (101), a first cover (111), a plurality of semi flexible first fingers (113), a second cover (117), and a plurality of semi flexible second fingers (119).

The frame (101) has a first side (203), a second side (205), a plurality of openings (107) preferably distributed along a periphery of one or more side rails (103), and one or more cross bars (104) joining the side rails (103). Each opening (107) has a first side (209) separated by a thickness dimension (210) from a second side (217) and one or more bounding cross-members (216). Each of the openings (107) has a generally rectangular cross section bounded by the thickness dimension (210) and a length dimension (108) representing the distance between opposite sides of the bounding cross members (216). Each opening (107) extends from the first side (203) to the second side (205) of the frame (101).

The thickness and length dimensions (210, 108) of each of these openings as well as the spacing between adjacent openings (107) was selected in view of the strength requirements of the frame and the electromagnetic shielding properties required by the electronics assembly (123), specifically wireless data modem, that needed to be packaged and protected. Additionally, optimizing the physical interior volume or space available for the wireless data modem dictated that all mechanical couplings securing the various elements of the housing or package as well as the electronics assembly (123) should be located at or near the periphery or side rails (103) of the frame (101).

A minimum width (220) of 3.0 mm and a maximum thickness (222) of 3.3 mm for each side rail (103) has been established by the PCMCIA packaging standard. The wireless data modem to be packaged in the preferred embodiment of the instant invention was expected to operate in the 805–825 MHz frequency band. From this the optimum thickness dimension (210) and length dimension (108) for the openings was determined to be, respectively, 0.7 mm at the narrowest point (parting line for the injection molding tool) and 6.75 mm with adjacent openings placed on 8.25 mm centers. The above dimensions leave 1.5 mm (8.25 mm–6.75 mm) for the cross member dimension along the length dimension axis. The cross member dimension along the frame thickness dimension was selected as 2.0 mm. Together these dimensions provide a sufficiently small aperture for radio frequency (RF) energy interference at the frequencies of concern and still ensure the structural integrity of the side rails (103). The resultant ladder configuration of the side rails approaches a theoretical 'best shape' for optimum strength/weight ratio for structural members.

Additionally, each opening features an undercut (218) whose function will be further described below. The frame is made from a material such as injection-molded polycarbonate (GE #SP121OR) which has been chosen for its combination of strength, moldability and dimensional stability.

The first cover (111) is substantially disposed, preferably largely in a first plane, on the first side (203) of the frame (101). The plurality of semi flexible first fingers (113) extend substantially perpendicular from and are mechanically coupled to, or preferably are formed from the same blank material as, the first cover. At least some portion of the plurality of first fingers (113) include a concave interlocking detail (215) and such first fingers are arranged and constructed for disposal in a corresponding one of the plurality of openings (107).

The material selected to fashion the first cover (111) from is a 0.2 mm thick, half hard, Stainless Steel 304, which provides a suitable combination of electrical characteristics and superior strength and stiffness properties. The first cover (111) may be manufactured using a die-cut, laser-etch, or wire Electrically Displaced Material (EDM) process, depending on the desired quantities. All bends may be created using standard forming techniques. Hence the first cover can be manufactured without any draw forming operations and thus the associated cost of tooling for such an operation.

The semi flexible first fingers (113) depicted in their initial position (223) by the dashed outline in FIG. 2 are biased during the manufacturing process for the first cover (111) by overbending the first fingers approximately 3 degrees from their final, assembled, position. The over bending allows the semi flexible first fingers (113) to be assembled directly through the openings (107) in the frame (101) with, theoretically, zero interference. Additionally, it pre-stresses the first fingers (113) so as to provide sufficient positive mechanical interference and thus electrical coupling, when assembled, with the semi flexible second fingers (119). Additionally, the ends of the semi flexible first fingers (113) are, preferably, formed into tabs (219) which serve to act as guides to direct the semi flexible second fingers (119) during the assembly of the second cover (117).

The tabs (219), preferably, also engage the undercut (218) in the frame (101), as depicted in FIG. 2, thereby locking the first cover and the second cover to the frame when the housing is assembled. Specifically, the self secured housing is assembled by placing the first cover (111) in position on the frame with the first fingers (113) disposed in corresponding openings (107) where each finger is occupying the initial position (223). The second cover (117) is then firmly pressed into position with the second fingers (119) each urging a corresponding one of the first fingers (113) toward the first side (209) of the opening (107) and thus urging the tabs (219) to engage the undercuts (218).

The second cover (117), in the prefered embodiment, is substantially disposed largely in a second plane, on the second side (205) of the frame (101). The plurality of semi flexible second fingers (119) extend substantially perpendicular from and are mechanically coupled to, or preferably are formed from the same blank material as, the second cover. At least some portion of the plurality of second fingers (119) include a convex interlocking detail (221) and such second fingers are arranged and constructed for disposal in the corresponding one of the plurality of openings (107). The second fingers (119) are each arranged to urge a corresponding one of the first fingers (113) toward the side (209) of the opening (107) and to thus engage the convex interlocking detail (221) with the concave interlocking detail (215), whereby the frame (101) is secured between the first cover (111) and the second cover (117). So arranged the second fingers (119) are, preferably electrically coupled to the first fingers (113) and the first cover (111) together with the second cover (117) will form an electromagnetic shield around a space or volume enclosed by the first cover (111) and the second cover.

Similar to the first cover (111), the second cover is formed of 0.2 mm thick, half hard stainless steel 304. When assembled the first and the second cover should not be allowed to bow, across the width of the frame, from there original substantially planar orientation as this may deviate from the PCMCIA package standards. To accomplish this, the second fingers (119) of the second cover (117) are approximately half the length of the first fingers (113) of the first cover (111), imparting a mechanical advantage to the second fingers over the first fingers, thus ensuring that the bulk of any stress transferred to either the first or the second cover, as a by-product of the assembly interconnection forces, would tend to be in the form of a concave deformation in the first cover (111). Observation of experimental assemblies suggests that no deformation of the first or second covers results from the forces generated by the assembly.

It will be appreciated by those of ordinary skill in the art that the apparatus disclosed provides an approach to housing or packaging an electronics assembly in a relatively small physical size without unduly sacrificing other essential requirements of such a package. This inventive apparatus may be advantageously deployed as a housing for a wireless packet data modem or other electronics assembly to provide a rugged aesthetically pleasing electromagnetically shielded package fully compatible with any of the PCMCIA industry standard packages. The present invention provides an exemplary electronics package that facilitates the operation of a computer and a wireless data radio deployed in close physical proximity and thus satisfies a growing and long-felt need of the wireless data communications industry for such functionality.

It will be apparent to those skilled in the art that the disclosed invention may be modified in numerous ways and may assume many embodiments other than the preferred form specifically set out and described above. Accordingly, it is intended by the appended claims to cover all modifications of the invention which fall within the true spirit and scope of the invention.

What is claimed is:

1. A self secured housing comprising in combination:

a frame comprising first and second rail members and at least one cross member joining the first and second rail members, each said rail member having an upper surface and a lower surface such that the upper surfaces of both rail members form a first side of the frame and the lower surfaces of both rail members form a second side of the frame, each said rail member having at least one opening extending from the first side through said rail member to the second side;

a first cover substantially disposed on said first side;

a plurality of semi flexible first fingers extending substantially perpendicular from and mechanically coupled to said first cover, a first and second set of said first fingers including a substantially concave interlocking detail, wherein the first set of said first fingers is arranged and constructed for disposal in said at least one opening of the first rail member, and the second set of said first fingers is arranged and constructed for disposal in said at least one opening of the second rail member;

a second cover substantially disposed on said second side; and a plurality of semi flexible second fingers extending substantially perpendicular from and mechanically coupled to said second cover, a first and second set of said second fingers including a substantially convex interlocking detail, wherein the first set of said second fingers is arranged and constructed for disposal in said at least one opening of the first rail member, and the second set of said second fingers is arranged and constructed for disposal in said at least one opening of the second rail member;

each of said first and second sets of said second fingers arranged to urge a corresponding one of said first and second sets of said first fingers toward a side of a corresponding one of said openings and to engage said convex interlocking detail with said concave interlocking detail, whereby said frame is secured between said first cover and said second cover.

2. The self secured housing of claim 1 wherein said frame further includes an undercut disposed on said side of each said opening and some of said first fingers include a tab that engages said undercut when said convex interlocking detail of each of the first and second sets of the first fingers is engaged with the concave interlocking detail of the corresponding one of the first and second sets of the second fingers.

3. The self secured housing of claim 1 further including a length, width, and height dimension that is compatible with a Personal Computer Memory Card International Association packaging standard.

4. A self secured housing for a modem constructed in accordance with a PCMCIA standard, comprising in combination:

a first cover comprising a substantially planar first member and a first and a second set of semi flexible fingers extending generally perpendicular from said planar first member, each of said first and second set of fingers including a substantially concave interlocking detail;

a frame comprising first and second rails and at least one cross member joining the first and second rails, each rail having openings arranged such that each of said first and second set of fingers are disposed within a corresponding one of said openings when said first cover is assembled to said frame, and a second cover comprising a substantially planar second member and a third and fourth set of semi flexible fingers extending substantially perpendicular from said planar second member, each of said third and fourth set of fingers including a substantially convex interlocking detail and arranged and constructed for disposal in said corresponding one of said openings and mechanically and electrically couple said concave interlocking detail with said convex interlocking detail of a corresponding one of said first and second set of fingers when said first cover and said second cover are assembled to said frame, thereby forming an electromagnetic shield around a space enclosed by said first and said second cover.

5. The self secured housing of claim 4 wherein said openings of each said rail further include a side having an undercut wherein each of the first and second set of fingers comprise a tab and each of the third and fourth set of fingers urge said tab of said corresponding one of said first and second set of fingers into engagement with said undercut of said corresponding opening when said first cover and said second cover are assembled to said frame.

* * * * *